United States Patent
Hsu

(10) Patent No.: US 10,782,354 B2
(45) Date of Patent: Sep. 22, 2020

(54) LOW VOLTAGE THRESHOLD ADJUSTING METHOD

(71) Applicant: Acer Incorporated, New Taipei (TW)

(72) Inventor: Chu-Hsiang Hsu, New Taipei (TW)

(73) Assignee: Acer Incorporated, New Taipei (TW)

( * ) Notice: Subject to any disclaimer, the term of this patent is extended or adjusted under 35 U.S.C. 154(b) by 113 days.

(21) Appl. No.: 16/219,910

(22) Filed: Dec. 13, 2018

(65) Prior Publication Data

US 2020/0116796 A1  Apr. 16, 2020

(30) Foreign Application Priority Data

Oct. 12, 2018  (TW) .............................. 107135897 A

(51) Int. Cl.
  *G01R 31/388*  (2019.01)
  *G01R 31/3835*  (2019.01)
  *H02J 7/00*  (2006.01)

(52) U.S. Cl.
  CPC ....... *G01R 31/388* (2019.01); *G01R 31/3835* (2019.01); *H02J 7/0063* (2013.01); *H02J 2007/0067* (2013.01)

(58) Field of Classification Search
  CPC ............... G01R 31/3835; G01R 31/388; H02J 2007/0067; H02J 7/0063; H02J 7/00
  See application file for complete search history.

(56) References Cited

U.S. PATENT DOCUMENTS

| | | | |
|---|---|---|---|
| 9,746,894 B1 | 8/2017 | Rajagopalan | |
| 2003/0052950 A1* | 3/2003 | Ohashi | B41J 2/17556 347/85 |
| 2016/0187432 A1* | 6/2016 | Saint-Marcoux | B60L 3/0046 702/63 |
| 2017/0326999 A1 | 11/2017 | Tani | |
| 2018/0134176 A1* | 5/2018 | Symanow | B60W 20/13 |

FOREIGN PATENT DOCUMENTS

| | | |
|---|---|---|
| CN | 205509601 | 8/2016 |
| CN | 103915862 | 7/2017 |
| CN | 108363018 | 8/2018 |
| TW | 201044734 | 12/2010 |
| TW | 201229544 | 7/2012 |
| TW | 201720011 | 6/2017 |

OTHER PUBLICATIONS

"Office Action of Taiwan Counterpart Application", dated Jun. 13, 2019, pp. 1-5.

* cited by examiner

*Primary Examiner* — Vuthe Siek
(74) *Attorney, Agent, or Firm* — JCIPRNET

(57) ABSTRACT

A low voltage threshold adjusting method is provided and includes the following steps: detecting whether a present voltage is lower than a low voltage threshold; detecting whether a present current exceeds a preset current threshold in response to that the present voltage is lower than the low voltage threshold; detecting whether a present temperature exceeds a preset temperature in response to that the present current exceeds the preset current threshold; checking whether a current state of charge (SOC) is higher than a preset SOC in response to that the present temperature does not exceed the preset temperature; and decreasing the low voltage threshold in response to that the current SOC is higher than the preset SOC.

9 Claims, 1 Drawing Sheet

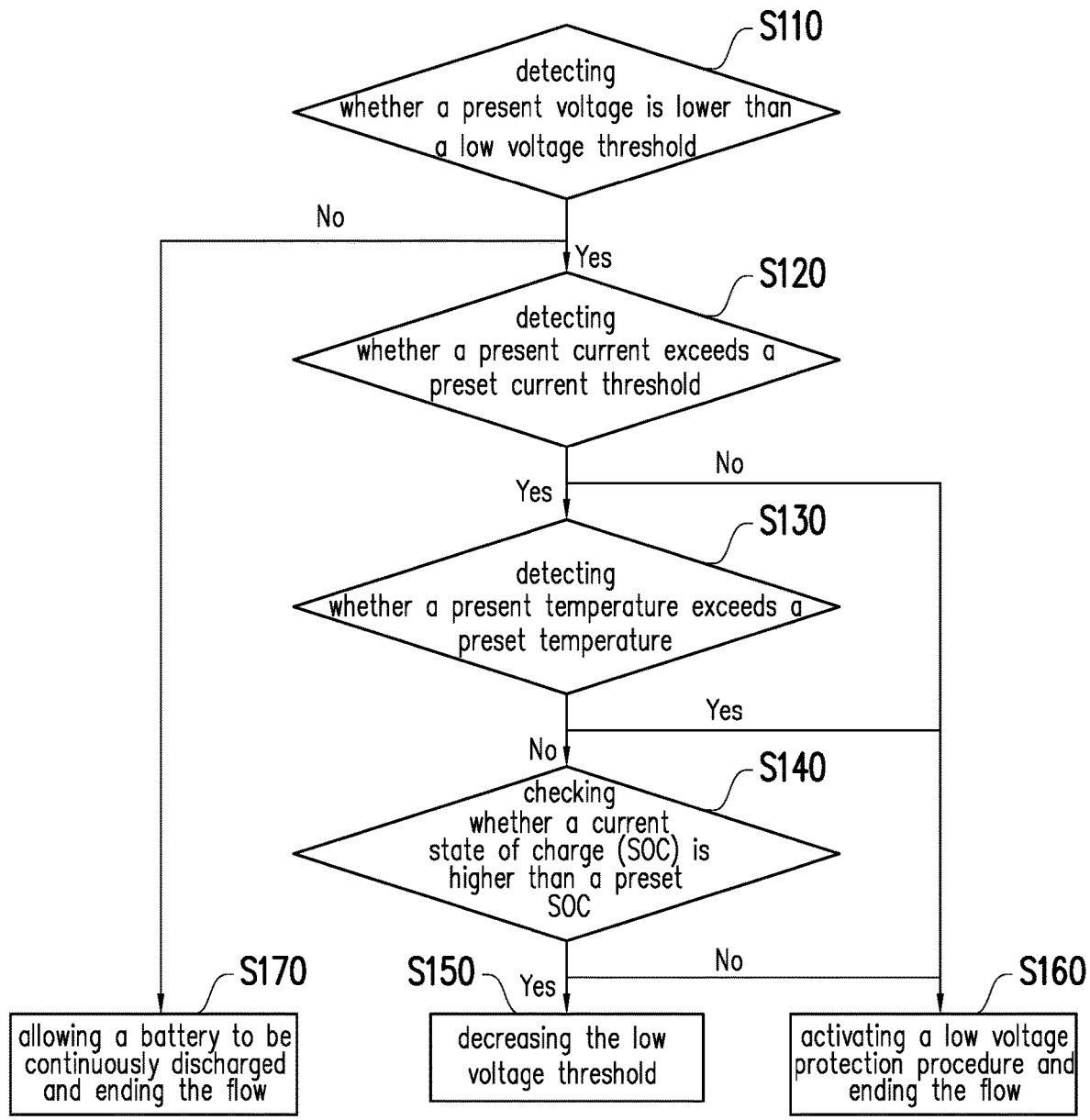

LOW VOLTAGE THRESHOLD ADJUSTING METHOD

CROSS-REFERENCE TO RELATED APPLICATION

This application claims the priority benefit of Taiwan application serial no. 107135897, filed on Oct. 12, 2018. The entirety of the above-mentioned patent application is hereby incorporated by reference herein and made a part of this specification.

BACKGROUND

Technical Field

The invention relates to a power management technique. More particularly, the invention relates to a low voltage threshold adjusting method.

Description of Related Art

Generally, batter management feature protective measures such as voltage measurement, excessive charging prevention, excessive discharging prevention (low voltage protection), abnormal temperature detection, etc., so as to prevent a battery from being affected by irreversible damages. For instance, when an excessive discharging condition is detected, the battery management system stops discharging, so as to prevent excessively high internal pressure from being generated inside the battery to affect activity of internal positive and negative ions. Nevertheless, when a sudden and high current passes, the positive and negative ions inside the battery change instantaneously, as such, voltage drops rapidly. When the voltage drops to the low voltage threshold, the battery management system stops the battery from being discharged. But in most cases, after the high current leaves, the voltage of the battery rises. In other words, the battery can be securely discharged but is forced to be stopped from outputting a current, so a user may experience an inconvenient using experience.

SUMMARY

The invention provides a low voltage threshold adjusting method capable of dynamically adjusting a low voltage threshold so as to prevent a battery from being stopped outputting a current temporarily owing to a low voltage which may cause inconvenience for a user.

A low voltage threshold adjusting method is provided by an embodiment of the invention and includes the following steps. Whether a present voltage is lower than a low voltage threshold is detected. Whether a present current exceeds a preset current threshold is detected in response to that the present voltage is lower than the low voltage threshold. Whether a present temperature exceeds a preset temperature is detected in response to that the present current exceeds the preset current threshold. Whether a current state of charge (SOC) is higher than a preset SOC is checked in response to that the present temperature does not exceed the preset temperature. The low voltage threshold is decreased in response to that the current SOC is higher than the preset SOC.

To sum up, in the low voltage threshold adjusting method provided by the embodiments of the invention, in response to that the voltage of the battery is lower than the low voltage threshold, whether the excessively low voltage condition is caused by an excessively high current is further confirmed. If the battery is ensured to be securely discharged, the low voltage threshold is further decreased, so that the battery is less susceptible to be stopped from outputting a current when being securely discharged.

To make the aforementioned more comprehensible, several embodiments accompanied with drawings are described in detail as follows.

BRIEF DESCRIPTION OF THE DRAWINGS

The accompanying drawings are included to provide a further understanding of the disclosure, and are incorporated in and constitute a part of this specification. The drawings illustrate exemplary embodiments of the disclosure and, together with the description, serve to explain the principles of the disclosure.

FIG. 1 is a schematic flow chart illustrating a low voltage threshold adjusting method according to an embodiment of the invention.

DESCRIPTION OF THE EMBODIMENTS

FIG. 1 is a schematic flow chart illustrating a low voltage threshold adjusting method according to an embodiment of the invention. In this embodiment, a low voltage threshold adjusting method is applied in a battery management system circuit. The battery management system circuit is formed together by, for example, a controller chip, a monitoring chip, and a diode connected to a battery. Further, the low voltage threshold adjusting method may be performed by, for example, the controller chip of the battery management system circuit or may be performed by an independent chip connected to the battery management system circuit, and the invention is not limited in this regard.

With reference to FIG. 1, when the battery is used, the battery management system circuit continuously detects a value of a present voltage of the battery. In particular, in step S110, the battery management system circuit detects whether the present voltage is lower than a low voltage threshold. If the value of the present voltage is not lower than the low voltage threshold, it means that at present, the voltage of the battery is not excessively low, so that a battery management system performs step S170 to allow the battery to be continuously discharged and end the flow.

For instance, in an embodiment of the invention, a preset low voltage threshold is, for example, 2.7 volts (V). If the battery management system circuit detects that the value of the present voltage is 3 volts, the battery management system allows the battery to be discharged continuously. Nevertheless, if the battery management system circuit detects that the value of the present voltage is 2.65 volts, the battery management system circuit continues performing the flow.

Nevertheless, in step S120, once the value of the present voltage is lower than the low voltage threshold, the battery management system circuit detects whether the present current exceeds a preset current threshold, so as to determine that whether the decrease in the present voltage is caused by a sudden and excessively high voltage. In response to that the present current does not exceed the preset current threshold, it means that the present voltage being lower than the low voltage threshold is caused by normal discharging to the low voltage threshold. Hence, the battery management system circuit performs step S160 to activate the low voltage protection procedure and end the flow.

For instance, in an embodiment of the invention, if a rated current is 1 (i.e., 1 C), the preset current threshold is, for example, 1.5 C or 2 C. Taking the preset current threshold being 1.5 C for example, if the battery management system circuit determines that the present current is 1.2 C, the battery management system circuit performs step S160 to activate the low voltage protection procedure and end the flow.

If the battery management system circuit determines that the present current is 1.7 C, it means that the excessively low voltage may be caused by a sudden and excessively high current, so that the battery management system circuit continues to perform the following flow.

In step S130, the battery management system circuit detects whether a present temperature exceeds a preset temperature. In response to that the present temperature exceeds the preset temperature, it means that a temperature of the battery exceeds a safe discharging temperature. If the battery continues to be discharged, irreversible chemical changes are to be generated inside the battery. Hence, the battery management system circuit executes the low voltage protection procedure and ends the flow.

For instance, in this embodiment, the preset temperature is, for example, 60 degrees Celsius. If the detected present temperature is 63 degrees Celsius, the battery management system circuit performs step S160 to activate the low voltage protection procedure and end the flow.

Nevertheless, if the battery management system circuit determines that the present temperature is 55 degrees Celsius, it means that the battery may continue to be discharged at a safe temperature, and the battery management system circuit thereby continues to perform the following flow.

In step S140, the battery management system circuit further checks whether a current state of charge (SOC) is higher than a preset SOC. Specifically, the SOC reflects remaining capacity of the battery. If the current SOC is lower than the preset SOC, it means that the remaining capacity of the battery is insufficient, and that the battery is required to be charged.

For instance, in this embodiment, the preset SOC is 15%. If the detected current SOC is 13%, the battery management system circuit performs step S160 to activate the low voltage protection procedure and end the flow.

Nevertheless, if the current SOC is higher than the preset SOC, it means that remaining capacity is sufficient and the battery may continue to be discharged. Hence, the battery management system circuit determines that the battery can continue to be discharged, so that the battery management system circuit directly lowers the low voltage threshold so as to allow the battery to keep on working.

For instance, in this embodiment, the preset SOC is 15%. If the detected current SOC is 33%, the battery management system circuit performs step S150 to decrease the low voltage threshold and end the flow. In this embodiment, when the battery management system circuit decreases the low voltage threshold every time, a voltage adjusting value acts as the basis for adjustment, so that the low voltage threshold is decreased by one unit of the voltage adjusting value or by a multiple of the voltage adjusting value. For instance, in this embodiment, the voltage adjusting value is 0.2 volt. That is, the low voltage threshold is adjusted from 2.7 volts to 2.5 volts.

In other embodiments of the invention, when decreasing the low voltage threshold, the battery management system circuit adjusts the low voltage threshold by a multiple of the voltage adjusting value according to the present voltage. For instance, if the present voltage is 2.4 volts, the battery management system circuit decreases the low voltage threshold from 2.7 volts by two units of the voltage adjusting value, that is, to 2.3 volts.

In other embodiments of the invention, when decreasing the low voltage threshold, the battery management system circuit directly adjusts the low voltage threshold to the present voltage. For instance, if the present voltage is 2.4 volts, the battery management system circuit directly adjusts the low voltage threshold to 2.4 volts. Nevertheless, the invention is not limited to the above embodiments.

It is worth mentioning that in an embodiment of the invention, after decreasing the low voltage threshold, the battery management system circuit continues to perform step S110, that is, continues to detect whether the present voltage is lower than the low voltage threshold. If the present voltage is once again lower than the low voltage threshold, the battery management system circuit performs step S110 to step S160 again, so as to ensure that whether the voltage drop is still caused by a sudden current. If the battery management system circuit determines that the current SOC is higher than the preset SOC in step S140 and intends to decrease the low voltage threshold, the battery management system circuit, for example, decreases the low voltage threshold by one unit of the voltage adjusting value again. Nevertheless, the invention is not limited in this regard.

In addition to that, in an embodiment of the invention, the battery management system circuit further determines whether the adjusted low voltage threshold is lower than a discharge termination voltage. The discharge termination voltage is the minimum critical value at which the battery may work safely. Specifically, the battery management system circuit treats the discharge termination voltage as the basis, adds a buffer voltage, and then sets the low voltage threshold, so as to ensure that the battery may work safely. Practically, if the present voltage is lower than the low voltage threshold but is higher than the discharge termination voltage, at this time, the battery may still be discharged under a considerably safe condition. If the present voltage is lower than the discharge termination voltage, and if the battery continues to be discharged, irreversible damages may be caused to the battery. Therefore, the battery management system circuit further determines whether the low voltage threshold is equal to or higher than the discharge termination voltage, so as to prevent the low voltage threshold to be excessively adjusted.

For instance, in an embodiment of the invention, the discharge termination voltage is, for example, 2 volts. That is, if the adjusted low voltage threshold is lower than 2 volts, the battery management system circuit resets the adjusted low voltage threshold to the pre-adjusted low voltage threshold. Alternatively, in other embodiments, the battery management system circuit adjusts the low voltage threshold to the discharge termination voltage, that is, 2 volts. Otherwise, in another embodiment, the battery management system circuit directly activates the low voltage protection procedure. Nevertheless, the invention is not limited thereto.

It is worth mentioning that in addition to a preset low voltage threshold, the battery management system circuit further stores an initial low voltage threshold. The initial low voltage threshold is a low voltage threshold being set before the batter is shipped. When the low voltage threshold adjusting method is executed, adjustment of the low voltage threshold is made to respond to a sudden and excessively high current. Therefore, after detecting that the present voltage is increased, the battery management system circuit further determines whether the present voltage is higher than an initially-preset voltage threshold. If the present voltage is higher than the initially-preset voltage threshold, the battery management system circuit re-adjusts the low voltage threshold to the initially-preset voltage threshold, so as to ensure that the low voltage protection procedure can be accurately performed.

In view of the foregoing, in the low voltage threshold adjusting method provided by the embodiments of the invention, in response to that the voltage of the battery is lower than the low voltage threshold, whether the excessively low voltage condition is caused by an excessively high current is further confirmed. Further, in the low voltage threshold adjusting method, conditions of current output are further determined, such as temperatures and the state of charge (SOC), so as to ensure that the low voltage threshold is decreased under the condition that the battery is securely discharged to maintain current output. Based on the above, when the battery is ensured to be securely discharged, the battery is less susceptible to be stopped from outputting a current when being securely discharged, so that the user may thereby enjoy an optimized using experience.

It will be apparent to those skilled in the art that various modifications and variations can be made to the disclosed embodiments without departing from the scope or spirit of the disclosure. In view of the foregoing, it is intended that the disclosure covers modifications and variations provided that they fall within the scope of the following claims and their equivalents.

What is claimed is:

1. A low voltage threshold adjusting method, comprising:
   detecting whether a present voltage is lower than a low voltage threshold;
   detecting whether a present current exceeds a preset current threshold in response to that the present voltage is lower than the low voltage threshold;
   detecting whether a present temperature exceeds a preset temperature in response to that the present current exceeds the preset current threshold;
   checking whether a current state of charge (SOC) is higher than a preset SOC in response to that the present temperature does not exceed the preset temperature; and
   decreasing the low voltage threshold in response to that the current SOC is higher than the preset SOC.

2. The low voltage threshold adjusting method as claimed in claim 1, wherein a low voltage protection procedure is activated in response to that the present current does not exceed the preset current threshold, the present temperature exceeds the preset temperature, or the current SOC is not higher than the preset SOC.

3. The low voltage threshold adjusting method as claimed in claim 1, wherein the preset current threshold is 1.5 times greater than a rated current or 2 times greater than the rated current.

4. The low voltage threshold adjusting method as claimed in claim 1, wherein the preset temperature is 60 degrees Celsius.

5. The low voltage threshold adjusting method as claimed in claim 1, wherein the low voltage threshold is 2.7 volts.

6. The low voltage threshold adjusting method as claimed in claim 1, wherein the low voltage threshold is decreased according to a voltage adjusting value or a multiple of the voltage adjusting value in response to that the low voltage threshold is decreased.

7. The low voltage threshold adjusting method as claimed in claim 1, further comprising:
   determining whether the adjusted low voltage threshold is lower than a discharge termination voltage; and
   performing the following in response to that the adjusted low voltage threshold is lower than the discharge termination voltage:
   resetting the adjusted low voltage threshold to the pre-adjusted low voltage threshold, adjusting the adjusted low voltage threshold to the discharge termination voltage, or activating the low voltage protection procedure.

8. The low voltage threshold adjusting method as claimed in claim 7, wherein the discharge termination voltage is 2 volts.

9. The low voltage threshold adjusting method as claimed in claim 1, further comprising:
   detecting an increase in the present voltage;
   determining whether the present voltage is higher than an initially-preset voltage threshold;
   adjusting the low voltage threshold to the initially-preset voltage threshold in response to that the present voltage is higher than the initially-preset voltage threshold.

* * * * *